(12) United States Patent
Warner et al.

(10) Patent No.: US 8,989,250 B1
(45) Date of Patent: Mar. 24, 2015

(54) METHOD AND APPARATUS FOR EQUALIZING DISTORTION IN A DIGITAL PRE-DISTORTION OBSERVATION PATH

(71) Applicant: PMC-Sierra US, Inc., Sunnyvale, CA (US)

(72) Inventors: William D. Warner, Maple Ridge (CA); Andrew S. Wright, Vancouver (CA); Bartholomeus T. W. Klijsen, Surrey (CA); Derek J. W. Ho, Vancouver (CA)

(73) Assignee: PMC-Sierra US, Inc., Sunnyvale, CA (US)

( * ) Notice: Subject to any disclaimer, the term of this patent is extended or adjusted under 35 U.S.C. 154(b) by 0 days.

(21) Appl. No.: 13/842,611

(22) Filed: Mar. 15, 2013

(51) Int. Cl.
*H04L 25/03* (2006.01)
*H03H 7/40* (2006.01)
*H04L 27/01* (2006.01)

(52) U.S. Cl.
CPC .................................... *H04L 27/01* (2013.01)
USPC ........... 375/229; 375/295; 375/296; 375/297; 375/232

(58) Field of Classification Search
CPC .............. H04B 1/44; H04B 1/38; H04B 3/46; H04B 1/62; H04B 7/0456; H04L 27/01; H04L 25/0212; H04L 25/022; H04L 27/368; H04L 2027/0038; H03F 1/3247; H03F 2201/3224; H03F 2200/451; H04W 52/52; H03B 2200/0046; H03G 3/3089; H03H 21/0027; H04N 19/00066
USPC ......... 375/219, 220, 222, 229–236, 295, 296, 375/297, 312, 316, 318, 240.26–240.29, 375/324, 325, 340, 341, 346
See application file for complete search history.

(56) References Cited

U.S. PATENT DOCUMENTS

| | | | |
|---|---|---|---|
| 6,917,389 B2* | 7/2005 | Lee ................................ | 348/608 |
| 7,689,180 B2* | 3/2010 | Grundlingh et al. ........... | 455/126 |
| 8,588,711 B2* | 11/2013 | Ishikawa et al. ............ | 455/114.3 |
| 2009/0111390 A1* | 4/2009 | Sutton et al. ..................... | 455/77 |
| 2011/0267146 A1* | 11/2011 | Finocchiaro et al. ............. | 331/2 |
| 2012/0002752 A1 | 1/2012 | Coan et al. | |
| 2012/0120990 A1* | 5/2012 | Koren et al. ................... | 375/219 |
| 2012/0163508 A1* | 6/2012 | Kuffner et al. ................. | 375/340 |
| 2012/0250790 A1 | 10/2012 | Yang et al. | |
| 2012/0300878 A1* | 11/2012 | Cai et al. ........................ | 375/296 |
| 2013/0107926 A1* | 5/2013 | Xia et al. ........................ | 375/224 |
| 2013/0162349 A1* | 6/2013 | Gao et al. ......................... | 330/75 |
| 2013/0243123 A1* | 9/2013 | Bai ................................. | 375/297 |
| 2014/0029683 A1* | 1/2014 | Morris et al. ................... | 375/267 |

\* cited by examiner

*Primary Examiner* — Sam K Ahn
*Assistant Examiner* — Linda Wong
(74) *Attorney, Agent, or Firm* — Dennis R. Haszko

(57) ABSTRACT

Methods and circuits for equalizing a linear response in an observation path of a digital pre-distorter. A method comprises generating observed signals in an observation path based on observing a transmit signal; down-converting the observed signals into intermediate frequencies using different LO frequencies; calculating a ratio using the intermediate frequencies; and equalizing the linear response of the observation path on the observed signals using the ratio. An apparatus comprises a directional coupler for observing a transmit signal and generating observed signals; a down-converter for converting the observed signals into intermediate frequencies using different LO frequencies; and an adaptive estimator for calculating a ratio using the intermediate frequencies and using the ratio to equalize a linear response from the observation path on the observed signals.

20 Claims, 7 Drawing Sheets

METHOD AND APPARATUS FOR EQUALIZING DISTORTION IN A DIGITAL PRE-DISTORTION OBSERVATION PATH

FIELD

The present disclosure relates generally to the field of communication signals. More particularly, the present disclosure relates to digital pre-distortions in communication signals.

BACKGROUND

Power amplifiers (PAs), used in the amplification of communication signals, are inherently non-linear. Non-linear amplification of communication signals can lead to the signal entering adjacent radio frequencies and interfering with other communication signals. This can create challenges in complying with regulatory standards for spectral emissions.

A common method of improving the linearity of a transmit signal from a power amplifier is to use a digital pre-distortion (DPD) circuit. A DPD circuit inversely models the power amplifier's gain and phase characteristics to introduce an inverse distortion, prior to amplification, into the transmit signal. The inverse distortion cancels the power amplifier's distortion, but retains the amplification. A typical DPD circuit observes an amplified signal and compares it to the original transmit signal and makes adjustments until the amplified signal resembles the transmit signal such that it is free of distortions.

In a DPD circuit, the observed signal must propagate through an observation path to certain elements of the DPD circuit so that it can be compared to the transmit signal. The observation path must, accordingly, not distort the observed signal otherwise the DPD circuit will perceive the distortions as being caused by the power amplifier and will attempt to remove. In a DPD circuit capable of imparting frequency dependent compensation, it is typically required that the observation path also be essentially free of linear distortions such as frequency dependent gain and phase distortions.

FIG. 1 shows a typical DPD circuit 100 for a wireless communication transmitter. The DPD circuit 100 has a digital domain 102 and an analog domain 104. In the digital domain 102, a transmit signal Vm(t) to be amplified is generated by a modem 106 and sent along a transmit path Tx to a complex gain pre-distorter 108 and also an adaptive estimator 110. The adaptive estimator 110 compares the transmit signal Vm(t) to an observed signal Vo(t) which has been down-converted and digitized. Based on the adaptive estimator's 110 comparison, the complex gain pre-distorter 108 introduces an inverse distortion into the transmit signal Vm(t) to produce a pre-distorted signal Vd(t). The inverse distortion also compensates for the "loop" response (both the linear and non-linear response) occurring in the analog domain 104 as discussed below.

The pre-distorted signal Vd(t) is converted from digital to analog by a digital-to-analog-converter (DAC) 112, and then propagated to a baseband-to-RF up-converter 114. The baseband-to-RF up-converter 114 is controlled by a first local oscillator (LO) 116. The baseband-to-RF up-converter 114 outputs a RF signal to a power amplifier 118. The power amplifier 118 outputs an amplified signal Va(t) to an antenna 120 for wireless transmission. A directional coupler 122, observes the amplified signal Va(t) and outputs an observed signal Vo(t). The observed signal Vo(t) is received by the RF-to-baseband down-converter 124. The RF-to-baseband down-converter 124 is controlled by a second LO 126. The observed signal Vo(t) is converted back to a digital signal with an analog-to-digital-converter (ADC) 128 and input into the adaptive estimator 110.

The down-converted digitized observed signal Vo(t) contains a loop response, namely, linear and non-linear distortions introduced by the DAC 112, the baseband-to-RF up-converter 114, the power amplifier 118, the directional coupler 122, the RF-to-baseband down-converter 124, and the ADC 128. The adaptive estimator 110 adjusts the pre-distorter 108 to compensate for the loop response. Compensation is desired for the distortions introduced by the baseband-to-RF up-converter 114 and the power amplifier 118. These distortions occur in the transmit path Tx. Compensation is not desired, however, for the linear and non-linear distortions introduced in the observation path OP by, namely, the directional coupler 122, the RF-to-baseband down-converter 124, and the ADC 128. This undesired compensation is essentially equivalent to introducing an additional complementary response at the input of the pre-distorter 108.

Additional complementary response at the input of the pre-distorter degrades the quality of the transmit signal as measured by an Error Vector Magnitude or other suitable measurement procedures. For example, the presence of a gain slope across frequencies in the complementary linear response at the input of the pre-distorter 108 will result in a different output power level for each of the frequency channels within a multi-carrier signal bandwidth. This can have a detrimental effect on the performance of a pre-distortion system if the locations of the active signal carriers are dynamically changing within the multi-carrier signal bandwidth.

BRIEF DESCRIPTION OF THE DRAWINGS

Embodiments of the present disclosure will now be described, by way of example only, with reference to the figures.

DETAILED DESCRIPTION

Figure 1:
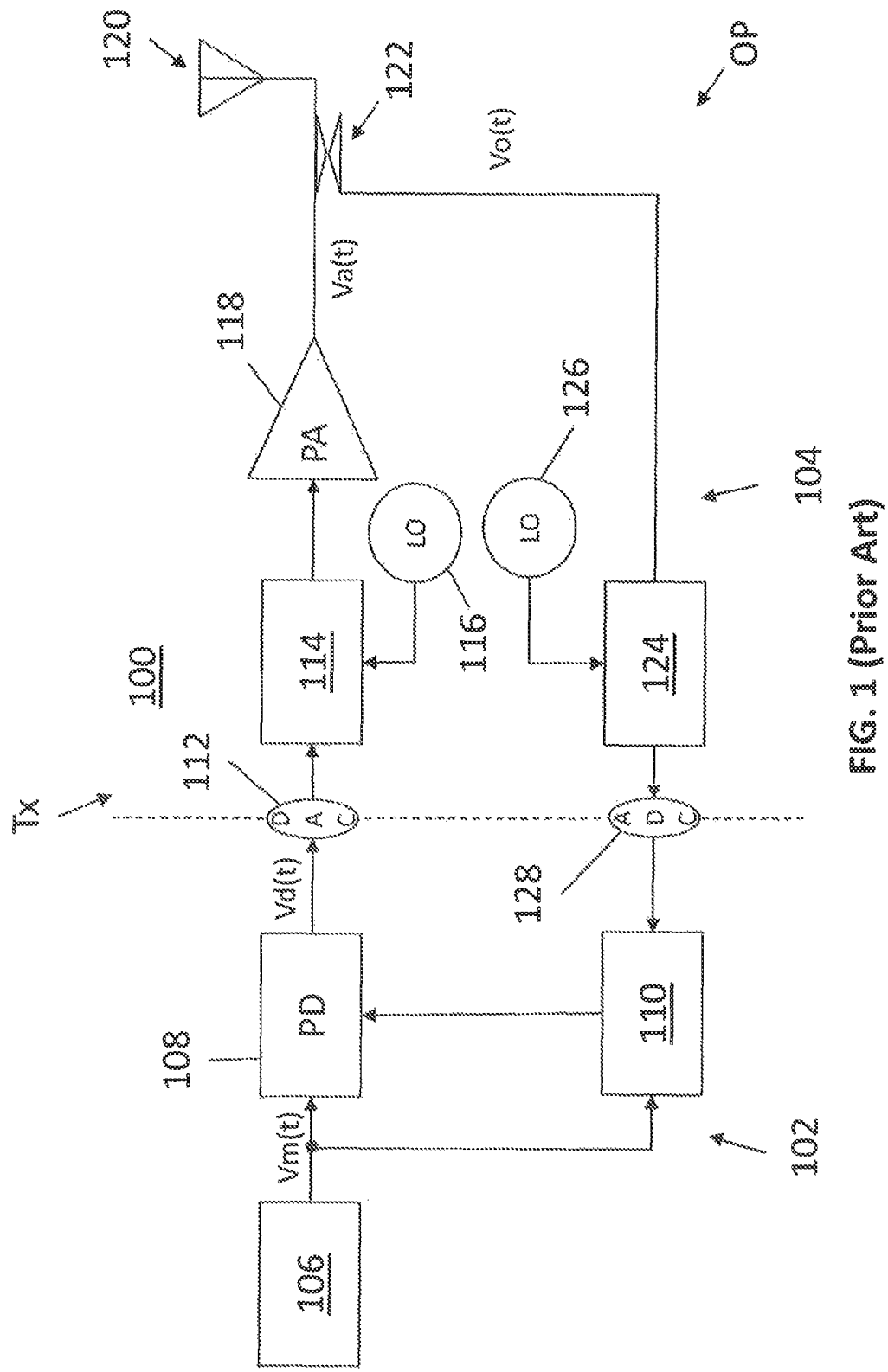
FIG. 1 shows a DPD circuit as known in the art.

This specification describes methods and circuits for identifying and equalizing a linear response from an observation path in a digital pre-distorter circuit.

A method comprises generating a first test transmit signal comprising signals separated in frequency by a first separation value; generating at least two observed signals in the observation path based on observing the first test transmit signal; down-converting the observed signals into intermediate frequencies using a different local oscillator (LO) frequency for each observed signal, the difference between the LO frequencies being equal to the first separation value; calculating a ratio between the intermediate frequencies; and equalizing the linear response from the observation path on the observed signals using the ratio.

In an example embodiment the observed signals are down-converted according to the formula fsamp×(N+/−0.25), where fsamp is a sampling rate of the analog-to-digital-converter. In another example embodiment, generating each of the observed signals comprises taking a plurality of measurements of the first test transmit signal. In another example embodiment, the method is repeated using a different separation value, and the ratio of the method using a larger separation value is used to adjust the ratio of the method using a smaller separation value to account for gain changes occurring in the observation path between observations. In another example embodiment, the frequency of a second LO is mixed with an amplitude controlled signal to create a mixed signal, and the mixed signal is added to the observed signals. In another example embodiment, the amplitude-controlled signal is noise. In another example embodiment, the noise is created by mixing a least significant bit from a digital-to-analog-converter with the second LO. In another example embodiment, the amplitude-controlled signal is a sine wave. In another example embodiment, the amplitude-controlled signal is a wideband signal. In another example embodiment, the test transmit signal Vm(t) is aligned with the observed signals and used during the step of calculating a ratio between the intermediate frequencies.

Another method comprises for generating at least two observed signals in the observation path based on observing a transmit signal; down-converting the observed signals into intermediate frequencies using a different local oscillator (LO) frequency for each observed signal, the difference between the LO frequencies being equal to a separation value; comparing each intermediate frequency to its own corresponding portion of the transmit signal using a finite impulse response filter to create models of a loop response of the observation path; calculating frequency responses of the observation path on the observed signals using the models of the loop response and the intermediate frequencies; calculating a ratio between the frequency responses; and equalizing the linear response from the observation path on the observed signals using the ratio.

A circuit comprises a signal generator for generating a test transmit signal comprising signals separated in frequency by a first separation value; a directional coupler in proximity to the signal generator for observing the first test transmit signal and generating in the observation path at least two observed signals; a down-converter connected to the directional coupler comprising a first local oscillator (LO) for converting the observed signals into intermediate frequencies using a different LO frequency for each observed signal, the difference being equal to the first separation value; and an adaptive estimator connected to the down-converter for calculating a ratio between intermediate frequencies, the ratio for use in equalizing the linear response from the observation path on the observed signals.

In an example embodiment, a second LO, an amplitude controlled signal generator for modulating the frequency of the second LO, and an adder for adding the modulated frequency of the second LO to the observed signals. In another example embodiment, the amplitude controlled signal generator generates a sinusoidal signal. In another example embodiment, the amplitude controlled signal generator generates noise. In another example embodiment, the noise is created by mixing a least significant bit from a digital-to-analog-converter with the second LO.

Another circuit comprises a directional coupler for observing a transmit signal and generating in the observation path at least two observed signals; a down-converter connected to the directional coupler, the down-converter comprising a local oscillator (LO) for down-converting the observed signals into intermediate frequencies using a different LO frequency for each observed signal, the difference being equal to a separation value; and an adaptive estimator connected to the down-converter, the adaptive estimator comprising a finite impulse response filter for comparing the transmit signal and the corresponding observed signals to create models of a loop response of the observation path, calculate frequency responses of the observation path on the observed signals using the models and the intermediate frequencies, calculate a ratio between the frequency responses, and equalize the linear response from the observation path based on the frequency response.

Other aspects and features of the present disclosure will become apparent to those ordinarily skilled in the art upon review of the following description of specific embodiments in conjunction with the accompanying figures.

Figure 2:
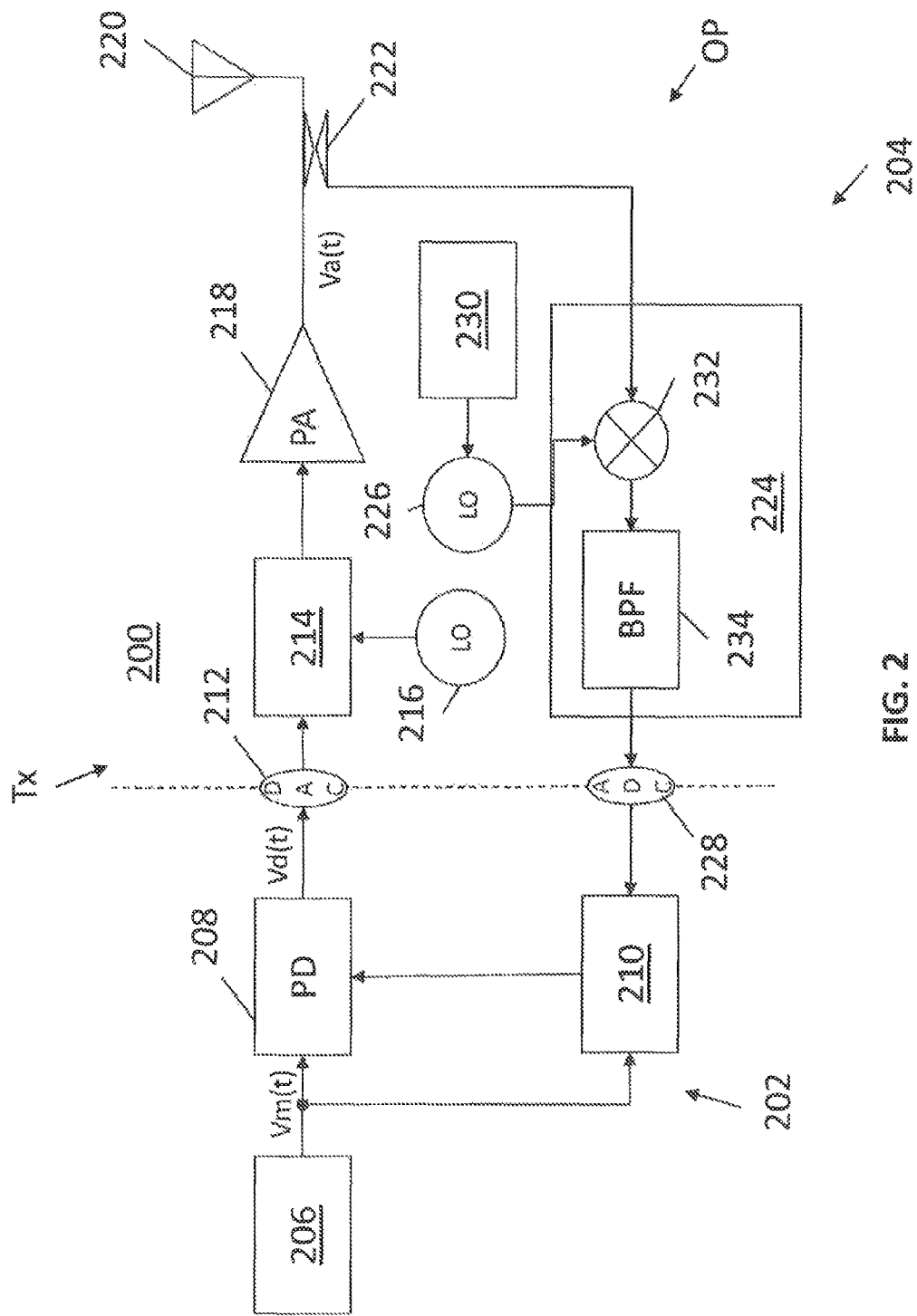
FIG. 2 shows a DPD circuit in accordance with an embodiment of the present disclosure.

FIG. 2 shows a DPD circuit 200 in accordance with an embodiment of the present disclosure. In an embodiment, the DPD circuit 200 is used in a wireless transmission system for characterizing the linear complex response, including gain and phase, of a signal observation path OP on an observed signal Va(t).

The DPD circuit 200 in FIG. 2 is similar to that which is shown in FIG. 1, with the following differences. An RF-to-baseband down-converter 224 comprises a band pass filter 234 and a mixer 232. The frequency of the mixer 232 is controlled by a local oscillator (LO) 226. In an embodiment, the frequency of the LO 226 is variable and controlled by a controller 230. In another embodiment, two LOs 226 with different frequencies are used, and the controller 230 switches between the two LOs 226 to vary the frequency input into the mixer 232.

Figure 3:
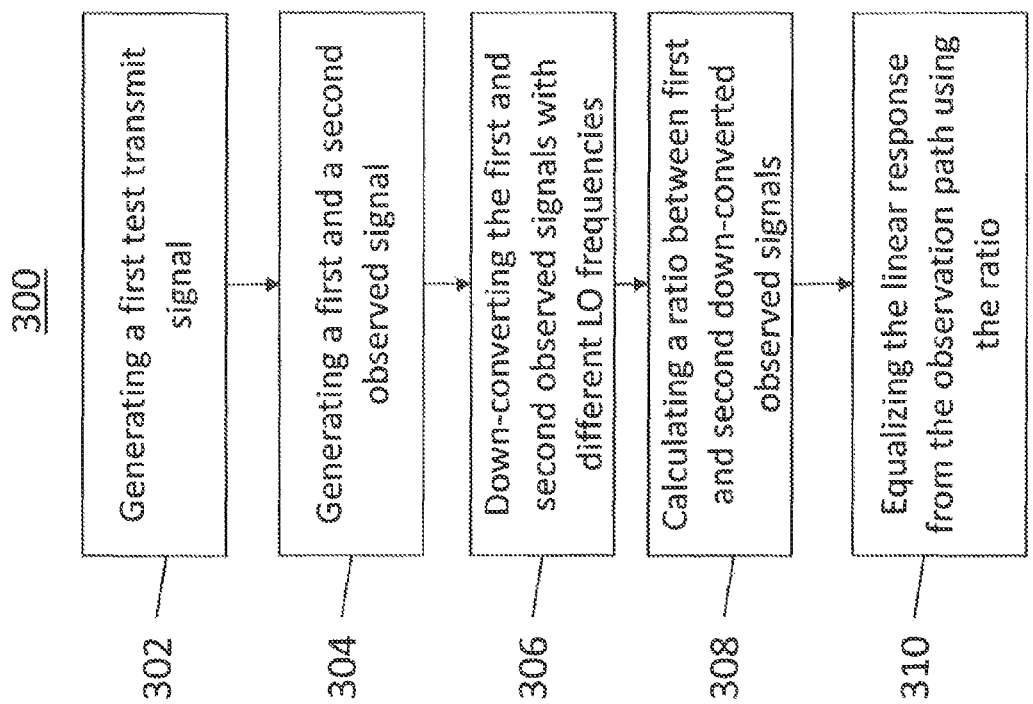
FIG. 3 shows a flow diagram of a method for operating the DPD circuit of FIG. 2 in accordance with an embodiment of the present disclosure.

The use of at least two different LO frequencies for the RF-to-baseband down-converter 224 allows for characterizing the linear complex response of an observation path OP on the observed signal Vo(t) as described in the method show in FIG. 3. Embodiments of the present disclosure do not characterize the non-linear response of the observation path OP on the observed signal Vo(t). Accordingly, it is preferable that implementations of the observation path OP, in accordance with the embodiments disclosed herein, minimize the potential non-linear response on an observed signal Vo(t)

The adaptive estimator 210 and pre-distorter 208 use the characterized linear complex response to equalize the amount of inverse distortion introduced into the transmit signal Vm(t) to produce the pre-distorted signal Vd(t).

A mathematical derivation of the analysis methodology in the frequency domain, which shows that a ratio between two observed signals down-converted using different LO frequencies can be used to characterize a linear response of an observation path on the observed signals, is provided below.

FIG. 3 shows a flow diagram of a method 300 for using the DPD circuit 200 of FIG. 2, in accordance with an embodiment of the present disclosure.

A test transmit signal Vm(t) is generated 302 using a multi-tone characterization signal comprising multiple sinusoidal signals separate in frequency by a constant value (the separation value). The test transmit signal Vm(t) is subjected to the frequency response of the transmit path Tx and amplified using a power amplifier 218.

A first observation of the amplified signal Va(t) is made 302 by the directional coupler 222. The first observation of the amplified signal Va(t) is down-converted 304 to an intermediate frequency signal, using the low-side RF down-converter 224, according to the formula $f_{samp} \times (N \pm 0.25)$, where $f_{samp}$ is an ADC 227 sampling rate, and N is a positive integer. The down-converted observed signal Vo(t) is then subjected to the frequency response of the remainder of the observation path OP, including the ADC 223 and an adaptive estimator 210, and retained in the adaptive estimator 210.

A second observation of the amplified signal Va(t) is made 304 by the directional coupler 222 to create a second observed signal Vo(t). The second observed signal Vo(t) is down-converted 306 to an intermediate signal using the low-side RF down-converter 224, according to the formula $f_{samp} \times (N \pm 0.25)$ and using a higher LO frequency. The higher LO frequency is caused by the controller 230. The LO frequency is increased by an amount equal to the separation value, namely, the difference in separation between the multiple sinusoidal signals in the test transmit signal Vm(t).

The second down-converted observed signal Vo(t) is then subjected to the frequency response of the remainder of the observation path OP, including the ADC 223 and the adaptive estimator 210. The digitized observed signal Vo(t) is retained in the adaptive estimator 210. The adaptive estimator 210 then calculates 308 a ratio between the two down-converted observed signals Vo(t) in accordance with the mathematical derivation described below. The calculated ratio is the frequency response of the observation path OP. The adaptive estimator 210 equalizes the linear complex response from the observation path on the observed signals using the ratio 310.

Preferably, there is no difference in phase, loop gain, or timing in the observation path from generating the observed signals 304 to calculating the ratio between the observed signals 308. Differences, however, may occur. A difference in phase will result in a phase slope which is essentially a time delay. There are known methods for compensating for the phase slope or time delay using a FIR filter.

A difference in loop gain between the two observations (other than a loop gain difference that occurs as a result of adjusting the LO 218), will cause the ratio to incorrectly include a gain slope. In effect, the pre-distorter 208 assumes that a gain slope exists in the transmit path and compensates accordingly. As further discussed below in relation to FIG. 4, to reduce the effect of loop gain (gain slope), four observations over two passes.

A difference in timing error between two observations will cause the ratio to incorrectly include a group delay slope. In effect, the pre-distorter 208 assumes that a group delay slope exists in the transmit path.

Figure 4:
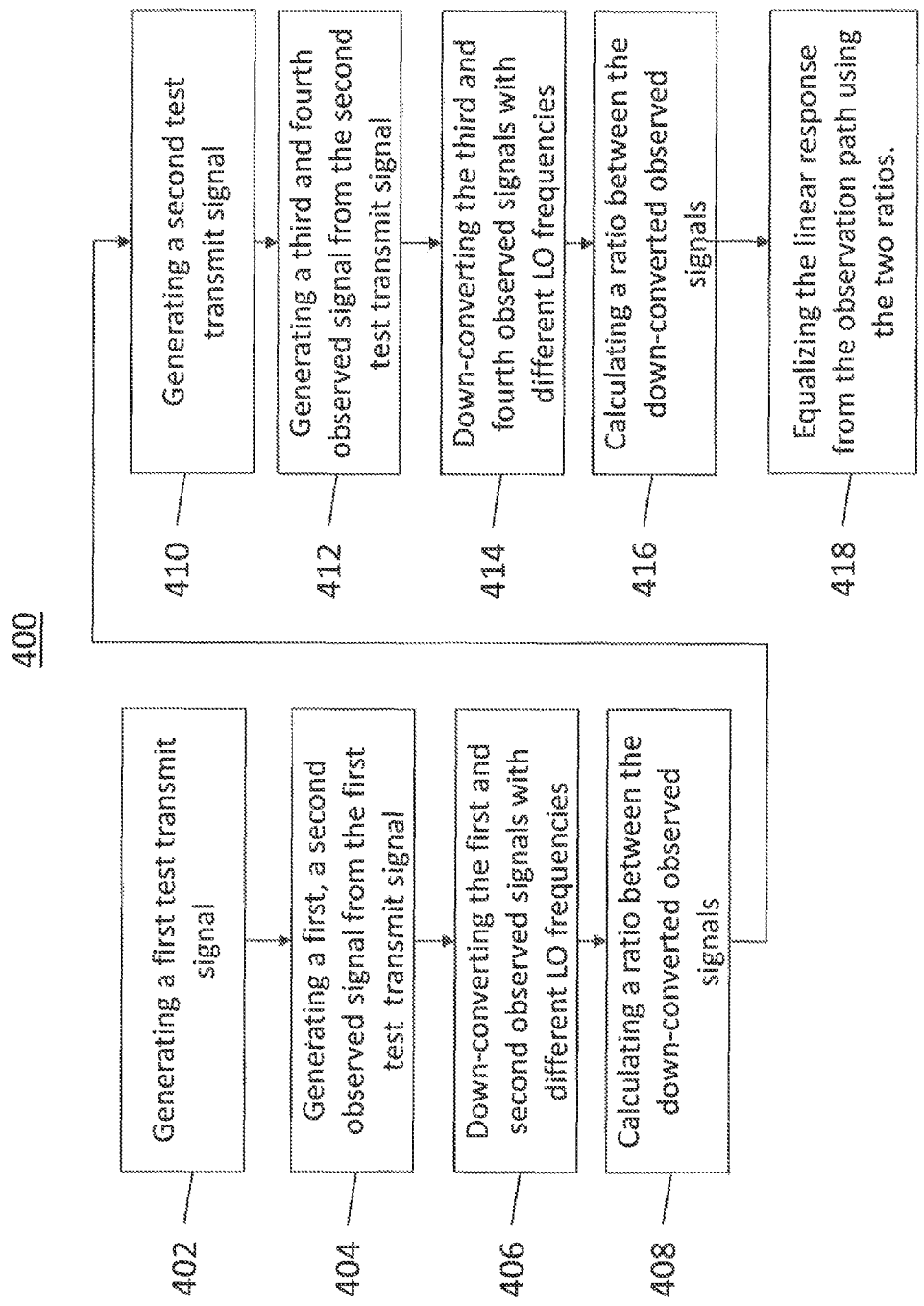
FIG. 4 shows a flow diagram of a method for operating the DPD circuit of FIG. 2 in accordance with another embodiment of the present disclosure.

FIG. 4 shows a flow diagram of a method 400 for operating the DPD circuit 200 of FIG. 2 in accordance with another embodiment of the present disclosure. The method 400 involves a two-pass approach.

In a first pass, a first test transmit signal Vm(t) is generated 402 using a multi-tone characterization signal comprising multiple sinusoidal signals separate in frequency by a constant value (the first separation value). In the first pass, the number of sinusoidal signals generated is small, and the separation value is large to more accurately identify the linear complex response at the extremes of the signal bandwidth. A first observation, and a second observations of the amplified test transmit signal Vm(t) are made 404. The observed signals Vo(t) are each down-converted 406 using a down-converter 224 with a different LO 214 signal frequency in accordance with the formula $(N+0.25)f_{samp}$. The difference between the two LO frequencies is equal to the separation value, namely, the separation between the multiple sinusoidal signals in the first test transmit signal Vm(t). Similar to method 300 of FIG. 3, a linear response of the observation path is calculated 408 using a ratio between the down-converted first and second observed signals.

A second pass is essentially identical to the first pass, the only difference being that when generating 410 a second test transmit signal Vm(t), the number of sinusoidal signals is larger, but the frequency separation between the signals is smaller (the second separation value) than when generating the first test transmit signal 402. The step of generating 412 a third and fourth observed signal from the second test transmit signal is similar to the first past. A smaller LO 214 frequency change, equal to the second separation value, between down-converting the third and fourth observed signals 414 is, however, required. The ratio between the down-converted observed signals is calculated 416.

Since the first pass uses the larger separation value between multiple sinusoidal signals of the test transmit signal Vm(t), it will be less sensitive to unintended gain changes occurring in the observation path OP between observations, but will have a lower resolution of the linear response. Accordingly, the outcome of the first pass is used to adjust the second pass which has a higher resolution of the linear response. The results of the second pass, incorporating the results of the first pass, are then used by the adaptive estimator 210 to equalize 418 the linear response of the observation path.

Figure 5:
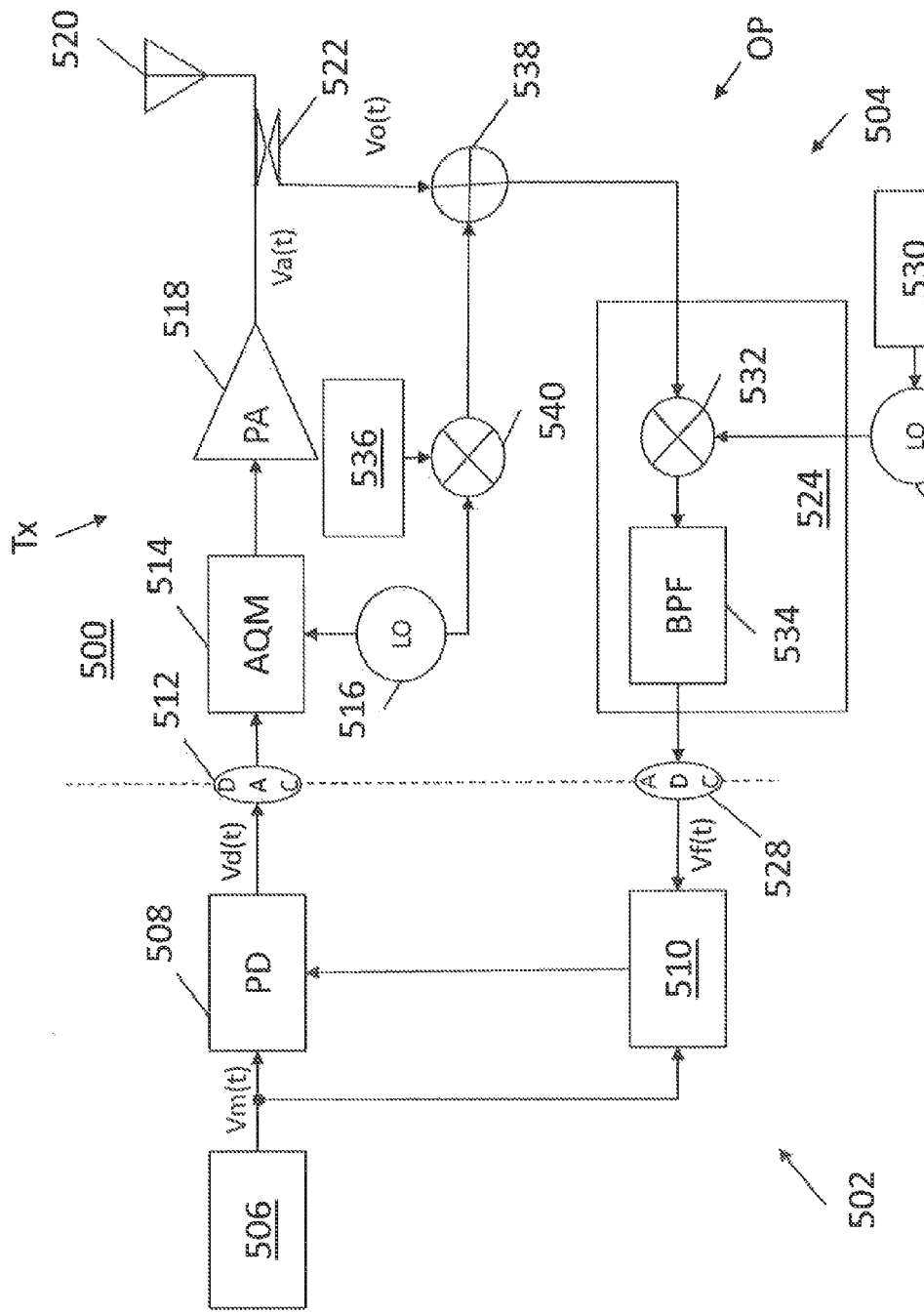
FIG. 5 shows an DPD circuit in accordance with another embodiment of the present disclosure.

FIG. 5 shows another DPD circuit 500 in accordance with an embodiment of the present disclosure. The DPD circuit 500 is similar to the DPD circuit 200 of FIG. 2. The DPD circuit 500 comprises a digital domain 502 and an analog domain 504. The digital domain 502 comprises a modem 506 for generating a transmit signal Vm(t). The transmit signal Vm(t) is communicated to both a complex gain pre-distorter 508 and an adaptive estimator 510. The adaptive estimator 510 controls the complex gain pre-distorter 508 to cause it to introduce an inverse distortion into the transmit signal Vm(t) to produce a pre-distorted signal Vd(t). The pre-distorted signal Vd(t) is converted from digital to analog by a digital-to-analog-converter DAC 512, and then sent to an Analog Quadrature Modulator (AQM) 514. The AQM 514 is controlled by a first LO 516 signal. The first LO 516 signal is also used for other purposes as discussed below.

The AQM 514 outputs a signal to a power amplifier 518. The power amplifier 518 outputs an amplified signal Va(t) to an antenna 520 for wireless transmission. A directional coupler 522 observes the amplified signal Va(t) and outputs an observed signal Vo(t). The observed signal Vo(t) is received by an adder 538 which adds to it an amplitude-controlled signal from the LO 516. The amplitude of the LO 516 signal is controlled by an amplitude controller 536 and a mixer 540. The added signal is sent to a down-converter 524. The down-converter 524 comprises a mixer 532 and a band pass filter 534. The mixer 532 down-converts the added signal by mixing it with a signal from a second LO 526 which is controlled by a frequency controller 530. The down-converted observed amplified signal Vo(t) is converted back to a digital signal with an analog-to-digital-converter ADC 528 and input into the adaptive estimator 510.

In an embodiment, in operation it is necessary to control the amplitude of the signal from the first LO 516 because it is difficult to detect the power of the test transmit signal Vm(t) and the power of the observed signal Vo(t) when the amplitude of the first LO 516 signal is too weak. Furthermore, in an embodiment, it may be necessary to suppress the first LO 516 signal if a DC/LO feed-through compensation structure is used in the transmit path Tx to compensate for the DC/LO feed-through of the AQM 516. The presence of the added signal from the first LO 516 will degrade the ability of an adaptation engine from configuring the DC/LO feed-through compensation structure.

Similar to the method 300 as shown in the flow chart of FIG. 3, two observations are made, stored, and compared in the adaptive estimator 510. The signal from the first LO 516, added to the observed signal Vo(t), is analyzed in both observations to determine if there is any gain difference therebetween. Differences in gain are detected by comparing the power of the signal of the first LO 516 with the power of the observed signal Vo(t). The signal from the first LO 516 is removed numerically in the digital domain 502. The power of both observed signals Vo(t) is adjusted to remove the detected gain difference by scaling, in amplitude, one or both observed signals.

Alternatively, the least significant bit of the DAC 512 is mixed with the signal from the first LO 516 by the mixer 540 to create a noise. The noise is added (injected) into the observed signal Vo(t) to allow for characterization of the gain response caused by the observation path on the amplified signal Va(t).

Optionally, during operation it may be desirable to switch between the noise and the observed signal Vo(t) instead of adding the two signals together. This is because the presence of the observed signal Vo(t) would make it difficult to analyze the injected noise. Conversely, the presence of the noise in the observation path could create issues when operating the pre-distorter 508.

Figure 6:
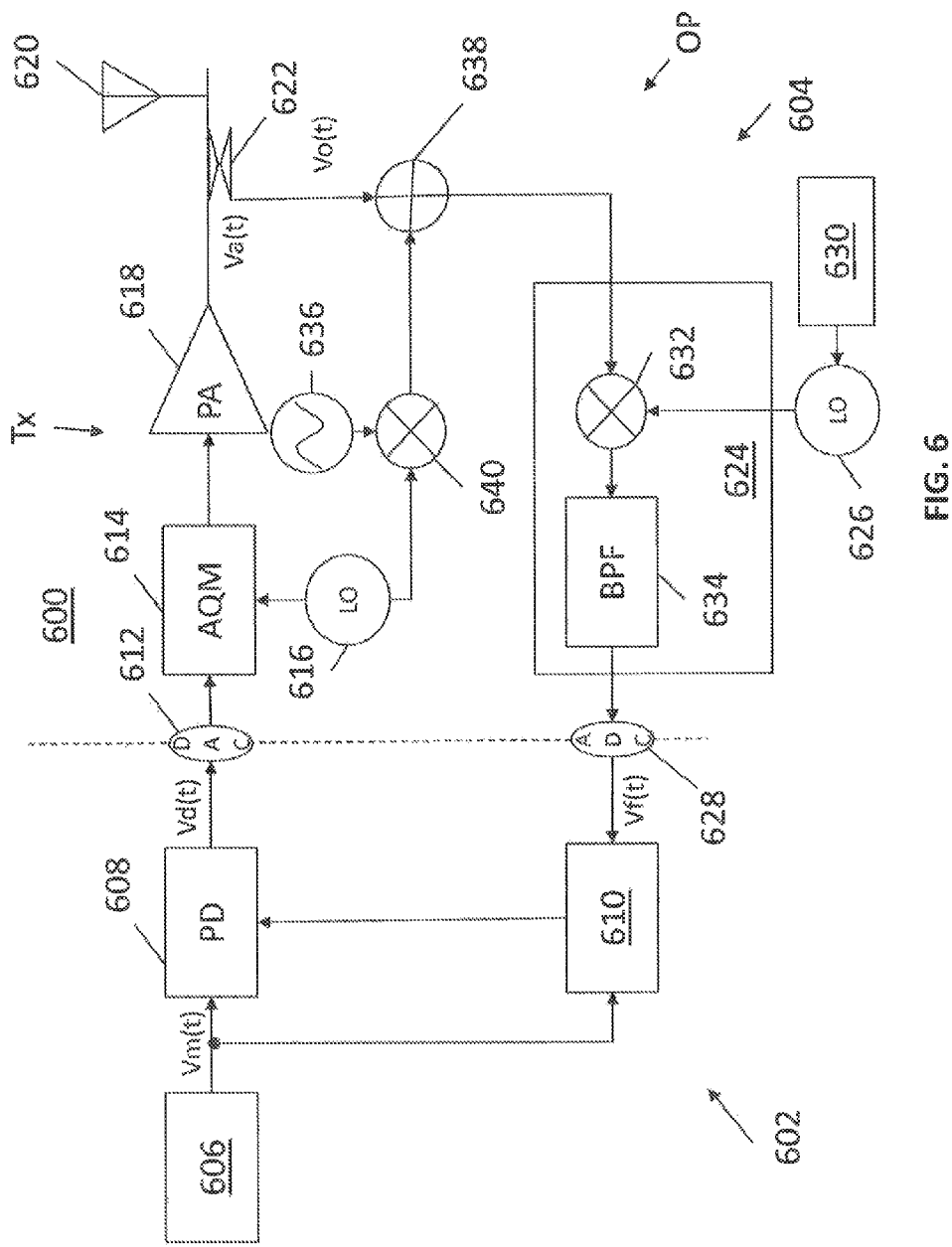
FIG. 6 shows a DPD circuit in accordance with a further embodiment of the present disclosure.

FIG. 6 shows a DPD circuit 600 which is similar to the DPD circuit 500 as shown in FIG. 5, the difference being that the amplitude controller 536 is a sine wave generator 636. When multiplied with the signal from the first LO 616, tone offsets above and below the frequency of the first LO 616, are created. The tone offsets are added to the observed signal Vo(t) with an adder 638. Using different sine wave frequencies, in a manner similar to that disclosed in the method of FIG. 4, allows for characterizing the linear complex response of the observation path OP. Optionally, either the signal from the power amplifier 616 or the modulated signal from the first LO 616 can be selected so that they do not interfere with one another.

In an another embodiment, the signal generated by the sine wave generator 636 is a wideband signal so that only two observations need to be made for characterizing the linear complex response of the observation path OP. In an alternate embodiment, a second DAC, in parallel with the DAC 612 is added, and the least significant bit of the second DAC is used, instead of the sine wave generator 636, to modulate the first LO 616.

Figure 7:
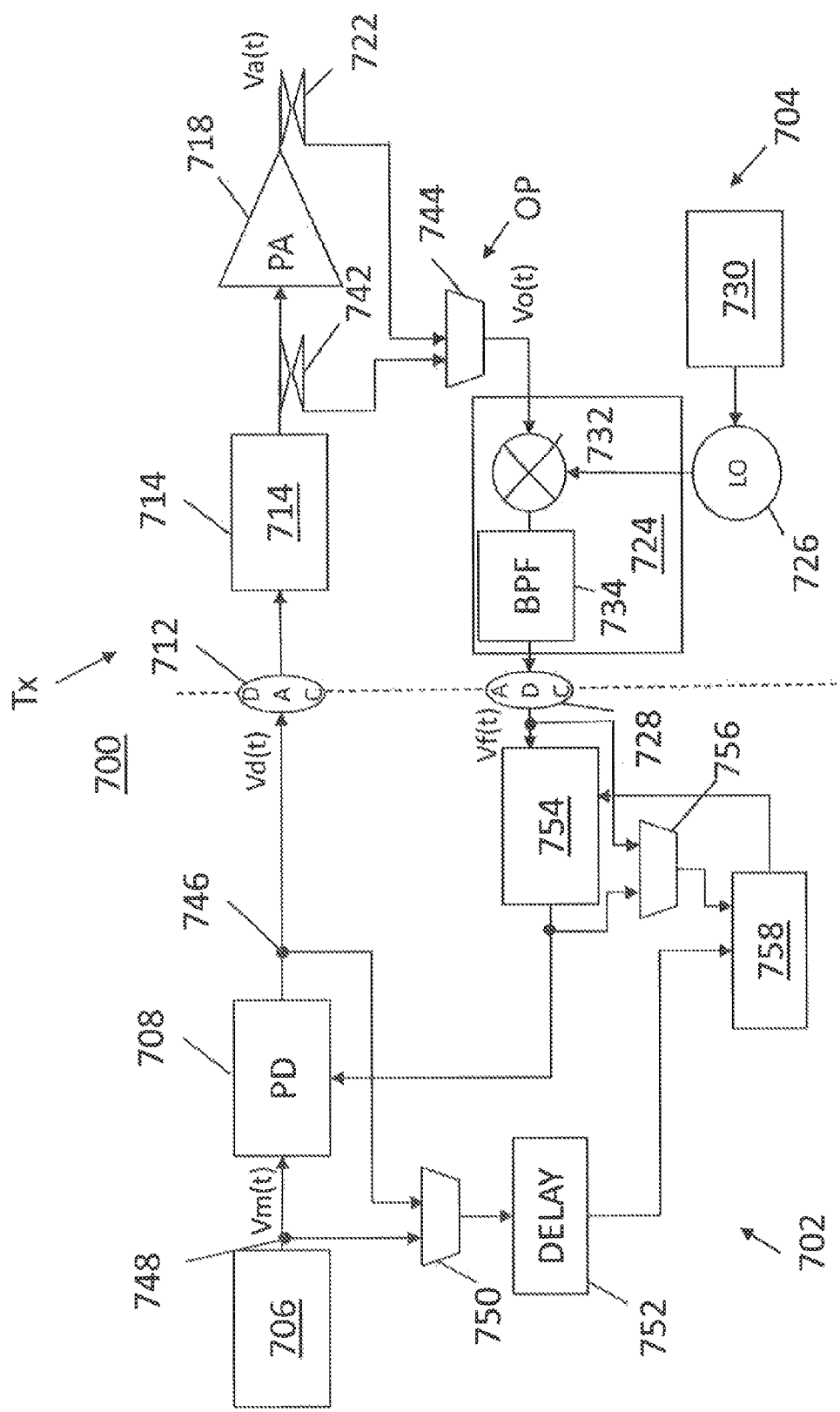
FIG. 7 shows a DPD circuit in accordance with a yet another further embodiment of the present disclosure.

FIG. 7 shows a DPD circuit 700 in accordance with another embodiment of the present disclosure. The DPD circuit 700 is similar to the DPD circuit 200 shown in FIG. 2 except that it provides an option of receiving the test transmit signal Vm(t) at an output 746 of a pre-distorter 708 and observing the pre-amplified signal with a first directional coupler 742, or receiving the transmit signal Vm(t) at an input 748 of a pre-distorter 708 and observing the amplified signal Va(t) with a second directional coupler 722. MUXes 750 and 744 control which option is selected. Of course, to enable the digital pre-distortion functionality of the DPD circuit 700, the input 748 and directional coupler 722 are selected.

The DPD circuit 700 also comprises an observation compensation filter 754 and an adaptive estimator 758. The adaptive estimator 758 is responsible for analyzing a loop response in accordance with the method described in relation to FIGS. 3 and 4 and the mathematical derivation as outlined below. The outcome of the adaptive estimator is used to update a configuration of the observation compensation filter 754, which impacts the pre-distorter 708 so as to compensate for linear distortions caused by the observation path OP on the observed signal Vo(t).

In operation, the down-converted, digitized, observed signal Vo(t) prior to or after the application of the compensation filter 754, is selected using a MUX 756 and analyzed by the adaptive estimator 758 with a time-delayed version of either the pre-distorted test transmit signal Vm(t) or the distorted test transmit signal Vd(t). A time delay 752 delays the pre-distorted test transmit signal Vm(t) or distorted test transmit signal Vd(t) an amount of time equal to the time it takes for the signal to propagate through the observation path OP. In this way, the comparison is performed on the same portion of the signals.

As noted, either the digital observed signal Vo(t) prior to, or after, the application of the observation compensation filter 754 can be used in the comparison. If the digital observed signal Vo(t) prior to the application of the compensation filter 754 is used, a full linear impairment of the observation path OP on the observed signal Vo(t) is determined. If the digital observed signal Vo(t) after the application of the compensation filter 754 is used, only a residual linear impairment of the observation path on the observed signal Vo(t) is determined.

There are several methods for determining the loop response. A test signal, consisting of sinusoidal tones separate in frequency by a separation value, can be used for the transmit signal Vm(t). As discussed below, during the linear distortion analysis, a fast Fourier transform (FFT) is performed on both the transmit signal Vm(t) and the digital observed signal Vo(t) to directly compute the loop response. If the transmit signal Vm(t) is aligned with the digital observed signal Vo(t) during comparison as described in relation to FIG. 7, then it is not necessary to compute the FFT of the test transmit signal Vm(t)—the FFT of the digital observed signal Vo(t) is sufficient.

In certain situations, such as, for example, during live operation, it may not be possible to generate a test transmit signal Vm(t) in the transmit path 702. In an alternate embodiment, any transmit signal Vm(t), not just a test transmit signal, is used to equalize a linear response from an observation path of a digital pre-distorter. The transmit signal Vm(t) can be, for example, a live data stream. When using a live data stream, however, it is more difficult to estimate the linear loop response of the observation path OP because the transmit signal Vm(t) is, generally, a wide-band signal and does not only contain the frequencies of interest.

In this alternate embodiment, two comparisons, between the transmit signal Vm(t) and a digitized and down-converted observed signals Vo(t) output by an ADC 728 and centered at 0 Hz, are performed in the adaptive estimator 758. The transmit signal Vm(t) is time delayed to correspond with the propagation of its observed signal Vo(t) through the observation path. For each comparison, the observed signal Vo(t) is down-converted by the down-converter 724 using a different LO 726 frequency, the difference in LO 726 frequency being equal to a separation value. The same considerations that would have been used to select a separation value if a test transmit signal Vm(t) were generated, are used when selecting the difference in LO 726 frequency. The comparisons are performed using a finite impulse and a least mean squared (LMS) adaptation method. The FIR filter is then a model of the loop response of the observation path. A Z-domain analysis of the FIR coefficients provides the frequency response at the desired frequencies.

What follows is a mathematical derivation of the analysis methodology in the frequency domain which shows that a ratio between two observed signals, down-converted using different LO frequencies (the difference being equal to spacing between the frequencies of a test signal) can be used to characterize a linear response of an observation path on the observed signals. A mathematical derivation of the analysis methodology in the frequency domain of the two-pass approach, as discussed above in relation to FIG. 4, is also provided. The analysis is conducted in the frequency domain. Those skilled in the art will recognize that there are multiple means to obtain the required frequency domain information.

To simplify the derivation of the analysis methodology, assume that the transmitted signal, Vref, is a complex multi-tone signal characterized by FFT bin frequency content

| $S_7^-$ | $S_5^-$ | $S_3^-$ | $S_1^-$ | $S_1^+$ | $S_3^+$ | $S_5^+$ | $S_7^+$ |
|---|---|---|---|---|---|---|---| where $S_0$ represents the DC bin, $S_n^+$ represents positive frequency bins, and $S_n^-$ represents negative frequency bins.

The transmitted signal is subject to the frequency response of the transmit path (the non-linearity of the power amplifier is ignored for now). Accordingly, the RF signal can be described by the frequency content:

| $S_7^-T_7^-$ | $S_5^-T_5^-$ | $S_3^-T_3^-$ | $S_1^-T_1^-$ | $S_1^+T_1^+$ | $S_3^+T_3^+$ | $S_5^+T_5^+$ | $S_7^+T_7^+$ |
|---|---|---|---|---|---|---|---|

This signal is then down-converted to $(N+0.25)f_{samp}$ using a low-side RF down-converter and subjected to the frequency response of the observation path. The observed signal can be described by the frequency content:

| $S_7^-T_7^-R_7^-$ | $S_5^-T_5^-R_5^-$ | $S_3^-T_3^-R_3^-$ | $S_1^-T_1^-R_1^-$ | $S_1^+T_1^+R_1^+$ | $S_3^+T_3^+R_3^+$ | $S_5^+T_5^+R_5^+$ | $S_7^+T_7^+R_7^+$ |
|---|---|---|---|---|---|---|---|
| $G_a e^{j\theta a}$ | $G_a e^{j\theta a}$ | $G_a e^{j\theta a}$ | $G_a e^{j\theta a}$ | $G_a e^{j\theta a}$ | $G_a e^{j\theta a}$ | $G_a e^{j\theta a}$ | $G_a e^{j\theta a}$ |
| $\exp(j\Delta t_a f_7^-)$ | $\exp(j\Delta t_a f_5^-)$ | $\exp(j\Delta t_a f_3^-)$ | $\exp(j\Delta t_a f_1^-)$ | $\exp(j\Delta t_a f_1^+)$ | $\exp(j\Delta t_a f_3^+)$ | $\exp(j\Delta t_a f_5^+)$ | $\exp(j\Delta t_a f_7^+)$ |

Note that an unknown gain, Ga, an unknown phase, θa, and an unknown time miss-alignment, $\exp(j\Delta t_a f)$, have been introduced. For later reference, let this frequency content be identified as H1(f).

The frequency of the LO of the down-converter is then increased by an amount equal to the difference in frequency between two adjacent tones of the transmitted signal, and a second signal observation is made. The observed signal can be described by the frequency content:

| $S_7^-T_7^-R_5^-$ | $S_5^-T_5^-R_3^-$ | $S_3^-T_3^-R_1^-$ | $S_1^-T_1^+R_1^+$ | $S_1^+T_1^+R_3^+$ | $S_3^+T_3^+R_5^+$ | $S_5^+T_5^+R_7^+$ | $S_7^+T_7^+R_9^+$ |
|---|---|---|---|---|---|---|---|
| $G_b e^{j\theta b}$ | $G_b e^{j\theta b}$ | $G_b e^{j\theta b}$ | $G_b e^{j\theta b}$ | $G_b e^{j\theta b}$ | $G_b e^{j\theta b}$ | $G_b e^{j\theta b}$ | $G_b e^{j\theta b}$ |
| $\exp(j\Delta t_b f_7^-)$ | $\exp(j\Delta t_b f_5^-)$ | $\exp(j\Delta t_b f_3^-)$ | $\exp(j\Delta t_b f_1^-)$ | $\exp(j\Delta t_b f_1^+)$ | $\exp(j\Delta t_b f_3^+)$ | $\exp(j\Delta t_b f_5^+)$ | $\exp(j\Delta t_b f_7^+)$ |

This includes an unknown gain, Gb, an unknown phase, θb, and an unknown time mis-alignment, $\exp(j\Delta t_b f)$. For later reference, let this frequency content be identified as H2(f).

If the ratio of frequency content of the two observations, H1(f) and H2(f), is computed, the signal and transmit chain components cancel resulting in

| $R_7^-/R_5^-$ | $R_5^-/R_3^-$ | $R_3^-/R_1^-$ | $R_1^-/R_1^+$ |
|---|---|---|---|
| $G_a e^{j\theta a}/G_b e^{j\theta b}$ | $G_a e^{j\theta a}/G_b e^{j\theta b}$ | $G_a e^{j\theta a}/G_b e^{j\theta b}$ | $G_a e^{j\theta a}/G_b e^{j\theta b}$ |
| $\exp(j(\Delta t_a - \Delta t_b)f_7^-)$ | $\exp(j(\Delta t_a - \Delta t_b)f_5^-)$ | $\exp(j(\Delta t_a - \Delta t_b)f_3^-)$ | $\exp(j(\Delta t_a - \Delta t_b)f_1^-)$ |
| $R_1^+/R_3^+$ | $R_3^+/R_5^+$ | $R_5^+/R_7^+$ | $R_7^+/R_9^+$ |
| $G_a e^{j\theta a}/G_b e^{j\theta b}$ | $G_a e^{j\theta a}/G_b e^{j\theta b}$ | $G_a e^{j\theta a}/G_b e^{j\theta b}$ | $G_a e^{j\theta a}/G_b e^{j\theta b}$ |
| $\exp(j(\Delta t_a - \Delta t_b)f_1^+)$ | $\exp(j(\Delta t_a - \Delta t_b)f_3^+)$ | $\exp(j(\Delta t_a - \Delta t_b)f_5^+)$ | $\exp(j(\Delta t_a - \Delta t_b)f_7^+)$ |

(Note that the above information has now been divided due to space limitations.)

The above can be simplified by observing that Ga/Gb can be replaced by a single term, G, $e^{j\theta a}/e^{j\theta b}$ can be replaced by a single term $e^{j\theta}$, and $\Delta t_a - \Delta t_b$ can be replaced by a single term $\Delta t$, resulting in the following:

| $R_7^-/R_5^-$ | $R_5^-/R_3^-$ | $R_3^-/R_1^-$ | $R_1^-/R_1^+$ |
|---|---|---|---|
| $G e^{j\theta}$ | $G e^{j\theta}$ | $G e^{j\theta}$ | $G e^{j\theta}$ |
| $\exp(j\Delta t f_7^-)$ | $\exp(j\Delta t f_5^-)$ | $\exp(j\Delta t f_3^-)$ | $\exp(j\Delta t f_1^-)$ |
| $R_1^+/R_3^+$ | $R_3^+/R_5^+$ | $R_5^+/R_7^+$ | $R_7^+/R_9^+$ |
| $G e^{j\theta}$ | $G e^{j\theta}$ | $G e^{j\theta}$ | $G e^{j\theta}$ |
| $\exp(j\Delta t f_1^+)$ | $\exp(j\Delta t f_3^+)$ | $\exp(j\Delta t f_5^+)$ | $\exp(j\Delta t f_7^+)$ |

The cumulative product is computed starting at the two middle terms and extending in both directions, yielding

| $R_7^-/R_1^+$ | $R_5^-/R_1^+$ | $R_3^-/R_1^+$ | $R_1^-/R_1^+$ |
|---|---|---|---|
| $G^4 e^{j4\theta}$ | $G^3 e^{j3\theta}$ | $G^2 e^{j2\theta}$ | $G e^{j\theta}$ |
| $\exp(j\Delta t(f_1^- + f_3^- + f_5^- + f_7^-))$ | $\exp(j\Delta t(f_1^- + f_3^- + f_5^-))$ | $\exp(j\Delta t(f_1^- + f_3^-))$ | $\exp(j\Delta t f_1^-)$ |
| $R_1^+/R_3^+$ | $R_1^+/R_5^+$ | $R_1^+/R_7^+$ | $R_1^+/R_9^+$ |
| $G e^{j\theta}$ | $G^2 e^{j2\theta}$ | $G^3 e^{j3\theta}$ | $G^4 e^{j4\theta}$ |
| $\exp(j(\Delta t f_1^+))$ | $\exp(j\Delta t(f_1^+ + f_3^+))$ | $\exp(j\Delta t(f_1^+ + f_3^+ + f_5^+))$ | $\exp(j\Delta t(f_1^+ + f_3^+ + f_5^+ + f_7^+))$ |

Arbitrarily, it can be assumed that R1+ is equal to 1. Making this substitution, and taking the reciprocal of the positive bin frequency data yields:

| $R_7^- G^4 e^{j4\theta}$ | $R_5^- G^3 e^{j3\theta}$ | $R_3^- G^2 e^{j2\theta}$ | $R_1^- G e^{j\theta}$ |
|---|---|---|---|
| $\exp(j\Delta t(f_1^- + f_3^- + f_5^- + f_7^-))$ | $\exp(j\Delta t(f_1^- + f_3^- + f_5^-))$ | $\exp(j\Delta t(f_1^- + f_3^-))$ | $\exp(j\Delta t f_1^-)$ |
| $R_3^+ G^{-1} e^{-j\theta}$ | $R_5^+ G^{-2} e^{-j2\theta}$ | $R_7^+ G^{-3} e^{-j3\theta}$ | $R_9^+ G^{-4} e^{-j4\theta}$ |
| $\exp(-j\Delta t f_1^+)$ | $\exp(j\Delta t(f_1^+ + f_3^+))$ | $\exp(-j\Delta t(f_1^+ + f_3^+ + f_5^+))$ | $\exp(-j\Delta t(f_1^+ + f_3^+ + f_5^+ + f_7^+))$ |

Ideally, it is desired to have G=1, θ=0, Δt=0. Assuming this to be the case, the above simplifies to:

| $R_7^-$ | $R_5^-$ | $R_3^-$ | $R_1^-$ | $R_3^+$ | $R_5^+$ | $R_7^+$ | $R_9^+$ |
|---|---|---|---|---|---|---|---|

This describes the frequency response of the observation path. Note that absolute time alignment of the observation is not required. It is only necessary for the two observations to have identical time miss-alignment.

Depending on the selection of the LO (high-side vs. low-side, and, $(N+0.25)f_{samp}$ vs. $(N+0.25)f_{samp}$), slight variations in the analysis will occur, but all variations will reveal the observation path frequency response.

There are two extensions to the basic LO frequency shifting technique that can be used to eliminate or reduce the sensitivity to gain differences between observations.

The first extension involves using the technique described above, but using fewer frequency bins with larger frequency separation for a 1st pass analysis to more accurately identify the linear complex response at the extremes of the signal bandwidth. The second pass would use more frequency bins with a smaller frequency separation to get a more detailed characterization of the linear complex response. The results are adjusted based on the first pass analysis.

The details of this extension can be described mathematically in a similar manner to the basic technique as described above. For the analysis, assume that a complex multi-tone signal characterized by FFT bin frequency content

| $S_2^-$ | $S_0$ | $S_2^+$ |
|---|---|---| where S0 represents the DC bin.

The transmitted signal will be subject to the frequency response of the transmit path. Therefore, the RF signal can be described by the frequency content

| $S_2^- T_2^-$ | $S_0 T_0$ | $S_2^+ T_2^+$ |
|---|---|---|

The standard LO frequency is defined to be that used in a low-side RF down-conversion system in which the signal is down-converted to $(N+0.25)f_{samp}$. The RF down-convert LO is adjusted higher in frequency, relative to the standard, by an amount equal to the difference in frequency between two adjacent tones of the transmitted signal, and a signal observation is made. The observed signal can be described by the frequency content

| $S_2^- T_2^- R_0$ $G_a e^{j\theta a}$ $\exp(j\Delta t_a f_2^-)$ | $S_0 T_0 R_2^+$ $G_a e^{j\theta a}$ $\exp(j\Delta t_a f_0)$ | $S_2^+ T_2^+ R_4^+$ $G_a e^{j\theta a}$ $\exp(j\Delta t_a f_2^+)$ |
|---|---|---| which includes an unknown gain, Ga, an unknown phase, θa, and an unknown time mis-alignment, $\exp(j\Delta t_a f)$.

The RF down-convert LO is then adjusted lower in frequency, relative to the standard, by an amount equal to the difference in frequency between two adjacent tones of the transmitted signal, and a second signal observation is made. The observed signal can be described by the frequency content

| $S_2^- T_2^- R_4^-$ $G_b e^{j\theta b}$ $\exp(j\Delta t_b f_2^-)$ | $S_0 T_0 R_2^-$ $G_b e^{j\theta b}$ $\exp(j\Delta t_b f_0)$ | $S_2^+ T_2^+ R_0$ $G_b e^{j\theta b}$ $\exp(j\Delta t_b f_2^+)$ |
|---|---|---| which includes an unknown gain, Gb, an unknown phase, θb, and an unknown time mis-alignment, $\exp(j\Delta t_b f)$.

If the ratio of frequency content of the two observations is computed, the signal and transmit chain components cancel resulting in

| $R_0/R_4^-$ $G_a e^{j\theta a}/G_b e^{j\theta b}$ $\exp(j(\Delta t_a - \Delta t_b)f_2^-)$ | $R_2^+/R_2^-$ $G_a e^{j\theta a}/G_b e^{j\theta b}$ $\exp(j(\Delta t_a - \Delta t_b)f_0)$ | $R_4^+/R_0$ $G_a e^{j\theta a}/G_b e^{j\theta b}$ $\exp(j(\Delta t_a - \Delta t_b)f_2^+)$ |
|---|---|---|

The above is simplified by replacing Ga/Gb with a single term, G, and replacing $e^{j\theta a}/e^{j\theta b}$ with a single term $e^{j\theta}$, and replacing $\Delta t_a - \Delta t_b$ with a single term $\Delta t$.

| $R_0/R_4^-$ $G e^{j\theta}$ $\exp(j\Delta t f_2^-)$ | $R_2^+/R_2^-$ $G e^{j\theta}$ $\exp(j\Delta t f_0)$ | $R_4^+/R_0$ $G e^{j\theta}$ $\exp(j\Delta t f_2^+)$ |
|---|---|---|

Arbitrarily, it can be assumed that R0 is equal to 1. Making this substitution, ignoring the center bin, and taking the reciprocal of the negative bin frequency data yields

| $R_4^-$ $G^{-1} e^{-j\theta}$ $\exp(-j\Delta t f_2^-)$ | $R_4^+$ $G e^{j\theta}$ $\exp(j\Delta t f_2^+)$ |
|---|---|

If the gain difference between two observations is 0.1 dB, and f2 is selected to be 5 MHz, then the Rx magnitude response at +/−10 MHz can be determined within 0.1 dB accuracy. If further accuracy is required, this analysis can be repeated with additional observations and the results averaged. This accurate information of the gain response at +/−10 MHz can be used to adjust the results of the more detailed analysis, thus reducing its sensitivity to gain fluctuations.

The second extension involves injecting an LO into the path of the down-converter in addition to the desired signal to be observed. Assuming the LO power is stable, the gain of the observed signal can be adjusted to compensate for gain differences between the two signal observations.

In the preceding description, for purposes of explanation, numerous details are set forth in order to provide a thorough understanding of the embodiments. However, it will be apparent to one skilled in the art that these specific details are not required. In other instances, well-known electronic structures and circuits are shown in block diagram form in order to not obscure the understanding. For example, specific details are not provided as to whether the embodiments described herein are implemented as a software routine, hardware circuit, firmware, or a combination thereof.

The above-described embodiments are intended to be examples only. Alterations, modifications and variations can be effected to the particular embodiments by those of skill in the art without departing from the scope, which is defined solely by the claims appended hereto.

What is claimed is:

1. A method for equalizing a digital pre-distorted signal for a linear complex response of an observation path of a digital pre-distorter, the method comprising:
    (a) generating a first multi-tone test transmit signal comprising multiple sinusoidal signal components separated in frequency by a first separation value;
    (b) generating first and second observed signals in the observation path based on observing the first multi-tone test transmit signal;
    (c) down-converting, using a first local oscillator (LO), the first observed signal into a first intermediate frequency signal and the second observed signal into a second intermediate frequency signal using a different local oscillator (LO) frequency for each of the first and second observed signals, a difference between the LO frequency for the first observed signal and the LO frequency for the second observed signal being equal to the first separation value;
    (d) calculating a first ratio between the first intermediate frequency signal and the second intermediate frequency signal; and
    (e) equalizing the digital pre-distorted signal for the linear complex response of the observation path using the first ratio.

2. The method of claim 1, wherein the down-converting comprises down-converting the first observed signal according to the formula fsamp×(N−0.25) and down-converting the second observed signal according to the formula fsamp×(N+0.25), where fsamp is a sampling rate of the analog-to-digital-converter and N is an integer.

3. The method of claim 1, further comprising:
prior to step (e), repeating steps (b), (c), and (d) for a plurality of iterations;
determining an average first ratio by averaging the first ratio calculated from each of the plurality of iterations; and
wherein in step (e), the digital pre-distorted signal for the linear complex response of the observation path is equalized using the average first ratio.

4. The method of claim 1, further comprising:
generating a second multi-tone test transmit signal comprising multiple sinusoidal signal components separated in frequency by a second separation value, wherein the second multi-tone test transmit signal comprises fewer sinusoidal signal components than the first multi-tone test transmit signal, and wherein the second separation value is less than the first separation value;
generating third and fourth observed signals in the observation path based on observing the second test transmit signal;
down-converting the third observed signal to a third intermediate frequency signal and the fourth observed signal to a fourth intermediate frequency signal using a different local oscillator (LO) frequency for each of the third and fourth observed signals, a difference between the LO frequency for the third observed signal and the LO frequency for the fourth observed signal being equal to the second separation value;
calculating a second ratio between the third intermediate frequency signal and the fourth intermediate frequency signal; and
equalizing the digital pre-distorted signal for the linear response of the observation path using the second ratio.

5. The method of claim 1, wherein of a signal generated by the first LO is mixed with an amplitude controlled signal to generate a mixed signal, and wherein the mixed signal is added to the first observed signal and to the second observed signal.

6. The method of claim 5, wherein the amplitude-controlled signal is noise.

7. The method of claim 6, wherein the noise is generated by mixing a least significant bit from a digital-to-analog-converter with the signal generated by the first LO.

8. The method of claim 5, wherein the amplitude-controlled signal is a sine wave.

9. The method of claim 5, wherein the amplitude-controlled signal is a wideband signal.

10. The method of claim 1, further comprising aligning the first multi-tone test transmit signal with the first and second observed signals.

11. A method for equalizing a digital pre-distorted signal for a linear complex response of an observation path of a digital pre-distorter, the method comprising
generating two observed signals in the observation path based on observing a transmit signal;
down-converting the two observed signals into two intermediate frequency signals using a different local oscillator (LO) frequency for each of the two observed signals, a difference between the LO frequency for each of the two observed signals being equal to a separation value;
comparing each of the two intermediate frequency signals to a corresponding portion of the transmit signal using a finite impulse response filter to create models of a loop response of the observation path;
calculating a frequency response of the observation path for each of the two observed signals using the created models;
calculating a ratio between the two calculated frequency responses; and
equalizing the digital pre-distorted signal for the linear complex response of the observation path using the ratio.

12. A circuit for equalizing a digital pre-distorted signal for a linear complex response of an observation path of a digital pre-distorter, the circuit comprising:
a signal generator configured to generate a first multi-tone test transmit signal comprising multiple sinusoidal signal components separated in frequency by a first separation value;
a directional coupler in proximity to the signal generator for observing the first multi-tone test transmit signal and generating, in the observation path, first and second observed signals;
a down-converter connected to the directional coupler comprising a first local oscillator (LO) for converting the first observed into a first intermediate frequency signal and the second observed signal into a second intermediate frequency signal using a different LO frequency for each of the first and second observed signals, the a difference between the LO frequency for the first second observed signal and the LO frequency for the second observed signal being equal to the first separation value; and
an adaptive estimator connected to the down-converter for and configured to calculate a first ratio between the first and second intermediate frequency signals, the and equalize the digital pre-distorted signal for the linear complex response of the observation path using the first ratio.

13. The circuit of claim 12, further comprising:
an amplitude controller for generating an amplitude controlled signal;
a mixer for mixing the amplitude control signal with a signal generated by a first LO;
an adder for adding the mixed signal to each of the first and second observed signals.

14. The circuit of claim 13, wherein the amplitude controlled signal is a sinusoidal signal.

15. The circuit of claim 13, wherein the amplitude controlled signal is noise.

16. The circuit of claim 15, wherein the noise is created by mixing a least significant bit from a digital-to-analog-converter with the signal generated by the first LO.

17. A circuit for equalizing a linear response from an observation path of a digital pre-distorter, comprising:
a directional coupler for observing a transmit signal and generating, in the observation path, two observed signals;
a down-converter connected to the directional coupler, the down-converter comprising a local oscillator (LO) for down-converting the observed signals into two intermediate frequency signals using a different LO frequency for each of the two observed signals, a difference between the LO frequency for each of the two observed signals being equal to a separation value; and
an adaptive estimator connected to the down-converter, the adaptive estimator comprising a finite impulse response filter for comparing each of the two intermediate frequency signals to a corresponding portion of the transmit signal to create models of a loop response of the observation path, calculate a frequency response of the observation path for each of the two observed signals using the created models, calculate a ratio between the two calculated frequency responses, and equalize the digital pre-distorted signal for the linear complex response of the observation path using the ratio.

18. The circuit of claim 12, wherein the first local oscillator of the down-converter converts the first observed signal according to the formula fsamp×(N−0.25) and converts the second observed signal according to the formula fsamp×(N+0.25), where fsamp is a sampling rate of the analog-to-digital-converter and N is an integer.

19. The circuit of claim 12, wherein
the directional coupler, the first local oscillator of the directional coupler, and the adaptive estimator repeatedly generate the first and second observed signals, convert the first observed signal into the first intermediate frequency signal and the second observed signal into the second intermediate frequency signal, and calculate the first ratio, for a plurality of iterations; and
the adaptive estimator is further configured to determine an average first ratio by averaging the first ratio calculated from each of the plurality of iterations for use in equalizing the digital pre-distorted signal for the linear complex response of the observation path.

20. The circuit of claim 12, wherein
the signal generator is further configured to generate a second multi-tone test transmit signal comprising multiple sinusoidal signal components separated in frequency by a second separation value, wherein the second multi-tone test transit signal comprises fewer sinusoidal signal components than the first multi-tone test transmit signal, and wherein the second separation value is less than the first separation value;
the directional coupler is further configured to observe the second test transmit signal and generate, in the observation path, third and fourth observed signals;
the first local oscillator of the down-converter is further configured to convert the third observed signal into a third intermediate frequency signal and the fourth observed signal into a fourth intermediate frequency using a different local oscillator (LO) frequency for each of the third and fourth observed signals, a difference between the LO frequency for the third observed signal and the LO frequency for the fourth observed signal being equal to the second separation value;
the adaptive estimator is further configured to calculate a second ratio between the third intermediate frequency signal and the fourth intermediate frequency signal, the second ratio for use in equalizing the digital pre-distorted signal for the linear response of the observation path.

* * * * *

UNITED STATES PATENT AND TRADEMARK OFFICE
CERTIFICATE OF CORRECTION

PATENT NO. : 8,989,250 B1  
APPLICATION NO. : 13/842611  
DATED : March 24, 2015  
INVENTOR(S) : William D. Warner et al.

Page 1 of 1

It is certified that error appears in the above-identified patent and that said Letters Patent is hereby corrected as shown below:

In the Claims

Column 13, Claim 5, Line 40, delete "wherein of" and insert therefor -- wherein --; and Column 14, Claim 12, Line 36, delete "the".

Signed and Sealed this
Eighth Day of September, 2015

Michelle K. Lee
*Director of the United States Patent and Trademark Office*